(12) United States Patent
Miyazawa et al.

(10) Patent No.: US 7,586,234 B2
(45) Date of Patent: Sep. 8, 2009

(54) PIEZOELECTRIC MATERIAL AND PIEZOELECTRIC DEVICE

(75) Inventors: Hiromu Miyazawa, Azumino (JP); Mayumi Hamada, Suwa (JP)

(73) Assignee: Seiko Epson Corporation (JP)

( * ) Notice: Subject to any disclaimer, the term of this patent is extended or adjusted under 35 U.S.C. 154(b) by 260 days.

(21) Appl. No.: 11/733,340

(22) Filed: Apr. 10, 2007

(65) Prior Publication Data

US 2007/0241642 A1    Oct. 18, 2007

(30) Foreign Application Priority Data

Apr. 12, 2006 (JP) .............................. 2006-110033

(51) Int. Cl.
*H01L 41/08* (2006.01)
(52) U.S. Cl. .................. 310/311; 310/358; 310/324; 252/62.9; 252/62.9 PZ
(58) Field of Classification Search ............... 310/311, 310/357, 358; 252/62.9
See application file for complete search history.

(56) References Cited

U.S. PATENT DOCUMENTS

| | | | | |
|---|---|---|---|---|
| 6,835,684 B2 * | 12/2004 | Tietz et al. | ........ | 501/134 |
| 6,885,540 B2 * | 4/2005 | Sakashita | ........ | 361/306.3 |
| 7,067,955 B2 | 6/2006 | Higuchi et al. | | |
| 7,348,715 B2 * | 3/2008 | Torii et al. | ........ | 310/358 |
| 7,456,548 B2 * | 11/2008 | Kubota et al. | ........ | 310/324 |
| 7,477,004 B2 * | 1/2009 | Nanataki et al. | ........ | 310/358 |

FOREIGN PATENT DOCUMENTS

| | | |
|---|---|---|
| JP | 2001-223404 | 8/2001 |
| JP | 2002-293628 | 10/2002 |
| JP | 2003-289230 | 10/2003 |
| JP | 2006-041127 | 2/2006 |
| JP | 2007-261864 | 10/2007 |

* cited by examiner

*Primary Examiner*—Mark Budd
(74) *Attorney, Agent, or Firm*—Harness, Dickey & Pierce, P.L.C.

(57) ABSTRACT

A piezoelectric material is expressed by a general formula (1) as follows: $(Bi_{1-x}Ba_x)(Fe_{1-x}Ti_x)O_3 \ldots$ (1), where x is greater than 0, but smaller than 1 (0<x<1).

11 Claims, 1 Drawing Sheet

PIEZOELECTRIC MATERIAL AND PIEZOELECTRIC DEVICE

The entire disclosure of Japanese Patent Application No. 2006-110033, filed Apr. 12, 2006 is expressly incorporated by reference herein.

BACKGROUND

1. Technical Field

The present invention relates to piezoelectric material and piezoelectric devices.

2. Related Art

Piezoelectric devices used for heads of ink jet printers have piezoelectric layers composed of piezoelectric material. $Pb(Zr, Ti)O_3$ (PZT) is a representative material as the piezoelectric material. For example, an example of related art is described in Japanese Laid-open patent application JP-A-2001-223404. However, PZT includes lead (Pb), and this may pose a serious environmental problem.

SUMMARY

In accordance with an aspect of the present invention, there is provided a novel piezoelectric material that is environmental-friendly and has excellent piezoelectric characteristics, and a piezoelectric device having a piezoelectric layer composed of the piezoelectric material.

A piezoelectric material in accordance with an embodiment of the invention is expressed by a general formula (1) as follows:

$$(Bi_{1-x}Ba_x)(Fe_{1-x}Ti_x)O_3 \quad (1),$$

where x is greater than 0, but smaller than 1 (0<x<1).

The piezoelectric material described above does not contain lead (Pb) that poses an environmental problem, and therefore is very useful. Further, the piezoelectric material is free of lead, but has excellent piezoelectric characteristics, whereby, for example, a sufficient amount of lattice distortion can be obtained.

In the piezoelectric material in accordance with an aspect of the embodiment of the invention, x may be greater than 0, but 0.50 or smaller (0<x≦0.50).

The piezoelectric material in accordance with an aspect of the embodiment of the invention may be oriented in (100) in a pseudo cubic expression.

In the present invention, being "oriented in (100)" includes a case where the entire crystal is oriented in (100), and a case where most of the crystals (for example, 90% or more) are oriented in (100), and the remaining crystals are in another orientation, for example, in (110) or the like. In other words, being "oriented in (100)" may be interchangeable with "being preferentially oriented in (100)." This similarly applies to, for example, the case of "being oriented in (110)."

The piezoelectric material in accordance with an aspect of the embodiment of the invention may be oriented in (110) in a pseudo cubic expression.

In the piezoelectric material in accordance with an aspect of the embodiment of the invention, a polarization orientation may be in a [111]orientation in a pseudo cubic expression.

In the present invention, when "a polarization orientation is in a [111] orientation in a pseudo cubic expression," this state includes a case where the polarization direction completely coincides with the [111] orientation in a pseudo cubic expression, and a case where the polarization direction is generally in the [111] orientation although being slightly deviated from the [111] orientation. The state of the "polarization orientation being generally in the [111] orientation in a pseudo cubic expression" includes, for example, a case where the polarization direction is between a <111> orientation in a pseudo cubic expression and a <100> orientation, and an angle between the polarization direction and the <111> orientation is, for example, 10° or less.

A piezoelectric device in accordance with an embodiment of the invention includes: a base substrate; a lower electrode formed above the base substrate; a piezoelectric layer formed above the lower electrode; and an upper electrode formed above the piezoelectric layer, wherein the piezoelectric layer is composed of a piezoelectric material that is expressed by a general formula (1) as follows:

$$(Bi_{1-x}Ba_x)(Fe_{1-x}Ti_x)O_3 \quad (1),$$

where x is greater than 0, but smaller than 1 (0<x<1).

It is noted that, in the description concerning the invention, the term "above" may be used as in, for example, "a specific object (hereafter referred to as "B") formed 'above' another specific object (hereafter referred to as "A")." In the description concerning the invention, when the term "above" is used in a manner used in the example described above, it is assumed to include a case in which B is formed directly on A, and a case in which B is formed over A through another object.

The piezoelectric device in accordance with an aspect of the embodiment of the invention may include an elastic layer formed above the base substrate and below the lower electrode.

It is noted that, in the description concerning the invention, the term "below" may be used as in, for example, "a specific object (hereafter referred to as "B") formed 'below' another specific object (hereafter referred to as "A")." In the description concerning the invention, when the term "below" is used in a manner used in the example described above, it is assumed to include a case in which B is formed directly below A, and a case in which B is formed below A through another object.

A piezoelectric device in accordance with another embodiment of the invention includes: a base substrate; a piezoelectric layer formed above the base substrate; a first electrode formed above the piezoelectric layer; and a second electrode formed above the piezoelectric layer and spaced from the first electrode, wherein the piezoelectric layer is composed of a piezoelectric material that is expressed by a general formula (1) as follows:

$$(Bi_{1-x}Ba_x)(Fe_{1-x}Ti_x)O_3 \quad (1),$$

where x is greater than 0, but smaller than 1 (0<x<1).

In the piezoelectric device in accordance with an aspect of the embodiment of the invention, x may be greater than 0, but 0.50 or smaller (0<x≦0.50).

In the piezoelectric device in accordance with an aspect of the embodiment of the invention, the piezoelectric material may be oriented in (100) in a pseudo cubic expression.

In the piezoelectric device in accordance with an aspect of the embodiment of the invention, the piezoelectric material may be oriented in (110) in a pseudo cubic expression.

In the piezoelectric device in accordance with an aspect of the embodiment of the invention, the piezoelectric material may have a polarization direction that may be in a [111] orientation in a pseudo cubic expression.

In the piezoelectric device in accordance with an aspect of the embodiment of the invention, the piezoelectric material may have a rhombohedral structure.

In the piezoelectric device in accordance with an aspect of the embodiment of the invention, the piezoelectric material may have a monoclinic structure.

DESCRIPTION OF EXEMPLARY EMBODIMENTS

Preferred embodiments of the invention are described below with reference to the accompanying drawings.

1.1. First, a piezoelectric material in accordance with an embodiment of the invention is described. The piezoelectric material in accordance with the embodiment is expressed by a general formula (1) as follows:

$$(Bi, Ba)(Fe, Ti)O_3 \quad (1)$$

The piezoelectric material in accordance with the present embodiment has a perovskite structure. The piezoelectric material may preferably be oriented in (100) or (110) in a pseudo cubic expression. The polarization direction of the piezoelectric material may preferably be in a [111] orientation in a pseudo cubic expression. The piezoelectric material that is oriented in (100) or (110) in a pseudo cubic expression, and having a polarization direction that is in a [111] orientation in a pseudo cubic expression can have excellent piezoelectric characteristics. The piezoelectric material in accordance with the present embodiment may preferably have a rhombohedral structure or a monoclinic structure. Also, the valence value of each of the elements in the piezoelectric material may preferably be +3 for Bi, +2 for Ba, +3 for Fe, +4 for Ti and −2 for O. As a result, the piezoelectric material can be charge-neutral.

Also, the general formula (1) may also be expressed by a general formula (1') or a general formula (1") as follows:

$$(Bi_{1-x}Ba_x)(Fe_{1-x}Ti_x)O_3 \quad (1')$$

$$(1-x)BiFeO_3-xBaTiO_3 \quad (1'')$$

It is noted that x may be greater than 0 but smaller than 1 ($0<x<1$), and may preferably be greater than 0, but 0.50 or smaller ($0<x\leqq0.50$). x indicates Ba composition in the A site of the perovskite structure, and Ti composition in the B site.

1.2. The piezoelectric material in accordance with the present embodiment does not contain lead (Pb) that causes an environmental problem, and therefore very useful. Furthermore, the piezoelectric material in accordance with the present embodiment is free of lead, but has excellent piezoelectric characteristics, whereby, for example, a sufficient amount of lattice distortion can be obtained. This is confirmed in experimental examples to be described below.

Figure 1:
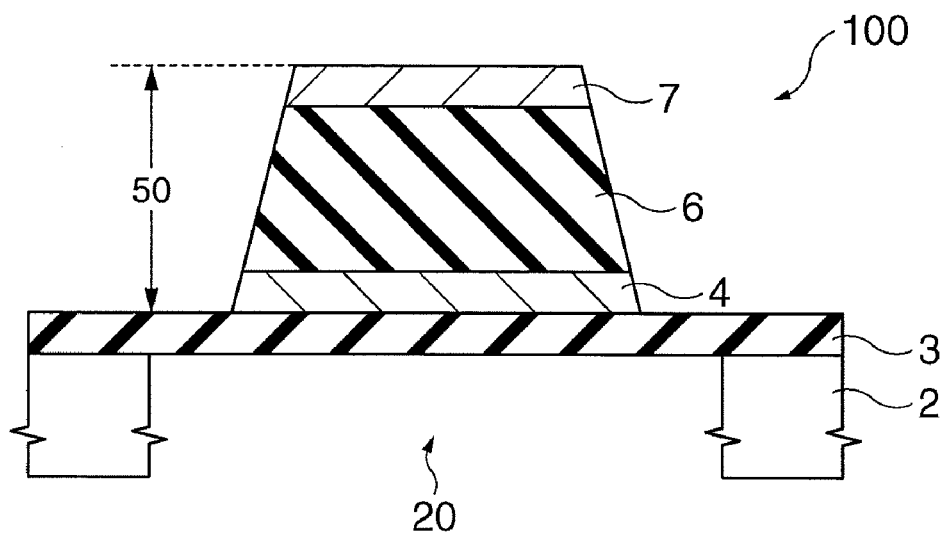
FIG. 1 is a cross-sectional view of a piezoelectric device in accordance with a first embodiment of the invention.

2.1. Next, a piezoelectric device 100 in accordance with a first embodiment of the invention is described. FIG. 1 is a cross-sectional view schematically showing an example of the piezoelectric device 100 in accordance with the first embodiment having a piezoelectric layer 6 composed of the piezoelectric material in accordance with the present embodiment.

The piezoelectric device 100 includes a base substrate 2, a lower electrode 4 formed above the base substrate 2, the piezoelectric layer 6 composed of the piezoelectric material described above and formed on the lower electrode 4, and an upper electrode 7 formed on the piezoelectric layer 6. The piezoelectric device 100 may further include an elastic layer 3 on the base substrate below the lower electrode 4. The lower electrode 4 can be formed on the elastic layer 3. It is noted that the piezoelectric device 100 may not have an elastic layer 3.

As the base substrate 2, for example, a single crystal silicon substrate in a (110) orientation may be used without any particular limitation. The base substrate 2 may be formed from a single substrate or a laminate including a substrate and another layer laminated on the substrate. The elastic layer 3 may be used, for example, as an elastic plate in an ink jet recording head. As the elastic layer 3, for example, a laminated film of silicon oxide and zirconium oxide layers laminated in this order may be used, without any particular limitation. The film thickness of the elastic layer 3 is, for example, about 1 μm. The base substrate 2 may have, for example, a cavity 20 opened in the base substrate 2, below the elastic layer 3.

The lower electrode 4 is one of electrodes for applying a voltage to the piezoelectric layer 6. The film thickness of the lower electrode 4 may be, for example, 100 nm-300 nm. As the lower electrode 4, for example, a film in which a conductive oxide (for example, $LaNiO_3$, $SrRuO_3$ or the like) layer having a perovskite structure is laminated on a metal (for example, platinum (Pt) or the like) film can be used, without any particular limitation. For example, the film composed of conductive oxide may preferably be oriented in (100) or (110) in a pseudo cubic expression, like the piezoelectric layer 6 composed of piezoelectric material described above. As a result, the piezoelectric layer 6 composed of the piezoelectric material having a perovskite structure and oriented in (100) or (110) in a pseudo cubic expression can be readily obtained on the lower electrode 4, through succeeding the crystal structure and orientation of the conductive oxide film.

The piezoelectric layer 6 is composed of the piezoelectric material in accordance with the present embodiment described above. The film thickness of the piezoelectric layer 6 may be, for example, 200 nm-1.5 μm, without particular limitation.

The upper electrode 7 is the other of the electrodes for applying a voltage to the piezoelectric layer 6. As the upper electrode 7, for example, a single layer of platinum (Pt), iridium (Tr), iridium oxide (IrOx), or conductive oxide (for example, $LaNiO_3$, $SrRuO_3$ or the like) having a perovskite structure, or a laminate of the aforementioned layers may be used, without any particular limitation. The film thickness of the upper electrode 7 may be, for example, 100 nm-200 nm.

The lower electrode 4, the piezoelectric layer 6 and the upper electrode 7 may be patterned, for example, in a manner shown in FIG. 1, thereby forming a columnar laminate (columnar section) 50.

2.2. Next, a method for manufacturing the piezoelectric device 100 in accordance with the first embodiment is described with reference to FIG. 1.

(A) First, an elastic layer 3 is formed on a base substrate 2. The elastic layer 3 may be formed by, for example, a thermal oxidation method, a chemical vapor deposition (CVD) method, a sputter method, or a vapor deposition method.

(B) Then, a lower electrode 4 is formed on the elastic layer 3. The lower electrode 4 may be formed by, for example, a sputter method, a spin coat method, a CVD method, or a laser ablation method.

(C) Next, a piezoelectric layer 6 composed of the piezoelectric material in accordance with the present embodiment is formed on the lower electrode 4. The piezoelectric layer 6 may be formed by using, for example, a sol-gel method, or a MOD (metal organic decomposition) method. In accordance with a concrete example, the method for forming the piezoelectric layer 6 by using a sol-gel method or a MOD method may be conducted as follows.

First, for example, a precursor solution for forming the piezoelectric layer 6 is coated on the lower electrode 4 by using, for example, a spin coat method (a precursor solution coating step). The precursor solution may be made through mixing organometallic compounds each containing a constituent metal of the piezoelectric material composing the piezoelectric layer 6 such that each of the constituent metals has a desired mole ratio, and dissolving or dispersing the mixture in an organic solvent such as alcohol. As the organometallic compounds that contain constituent metals of the piezoelectric material, for example, metal alkoxides, organic acid salts, and β diketone complexes can be used. As the organometallic compounds that contain constituent metals (Bi, Ba, Fe, Ti) of the piezoelectric material, the following material may be enumerated.

As an organometallic compound containing bismuth (Bi), for example, a bismuth isopropoxide may be enumerated. As an organometallic compound containing barium (Ba), for example, a barium ethoxide may be enumerated. As an organometallic compound containing iron (Fe), for example, an iron acetate may be enumerated. As an organometallic compound containing titanium (Ti), for example, a titanium isopropoxide may be enumerated. It is noted that the organometallic compounds containing the constituent metals of the piezoelectric material are not limited to the above.

A variety of additives, such as, stabilizer agent and the like may be added in the precursor solution if necessary. When hydrolysis and polycondensation are to be caused in the precursor solution, an appropriate amount of water together with acid or base as a catalyst may be added in the precursor solution. As the additive agent to be added to the precursor solution, for example, diethanolamine and acetic acid may be enumerated.

The revolution speed in the spin coat may be, for example, about 500 rpm in an initial stage and may be increased in succession to about 2000 rpm to avoid coating irregularity.

Next, a heat treatment is conducted in an air atmosphere using a hot plate or the like, for example, at a temperature that is about 10° C. higher than the boiling temperature of the solvent used in the precursor solution (dry thermal treatment step).

Then, in order to decompose and remove ligands of the organometallic compounds used in the precursor solution, a heat treatment is conducted in an air atmosphere using a hot plate or the like, for example, at a temperature of about 300° C.-400° C. (degrease thermal treatment step).

A series of steps consisting of the precursor solution coating step, the dry thermal treatment step, and the degrease thermal treatment step may be repeated a desired number of times depending on a desired film thickness.

Then, crystallization annealing in other words, an annealing step for crystallization is conducted to form the piezoelectric layer 6. The crystallization annealing may be conducted by, for example, RTA (Rapid Thermal Annealing) or the like, in an oxygen atmosphere at about 550° C.-650° C.

The piezoelectric layer 6 may be formed not only by a sol-gel method or a MOD method, but also by a vapor phase method, such as, for example, a laser ablation method, a sputter method or the like.

(D) Next, an upper electrode 7 is formed on the piezoelectric layer 6. The upper electrode 7 may be formed by, for example, a sputter method, a spin coat method, a chemical vapor deposition (CVD) method, or a laser ablation method.

(E) Then, post annealing may be conducted depending on the requirements. By this, good interfaces between the piezoelectric layer 6 and the upper and lower electrodes can be formed, and the crystallinity of the piezoelectric layer 6 can be improved. The post annealing may be conducted by, for example, RTA in an oxygen atmosphere.

(F) Then, each of the members is patterned by etching depending on the requirements, thereby forming, for example, a columnar section 50, a cavity 20 and the like.

By the steps described above, the piezoelectric device 100 in accordance with the first embodiment is manufactured.

2.3. In the piezoelectric device 100 in accordance with the first embodiment, the piezoelectric layer 6 is composed of the piezoelectric material described above. As described above, the piezoelectric material is free of lead, but has excellent piezoelectric characteristics. Therefore, by the present embodiment, a piezoelectric device that is environmental-friendly and excels in piezoelectric characteristics can be provided.

2.4. Next, experimental examples are described.

The following method was conducted to obtain experimental samples of the piezoelectric device 100 in accordance with the first embodiment.

First, a $SiO_2$ film having a film thickness of 500 nm and a $ZrO_2$ film having a film thickness of 500 nm were laminated on a silicon substrate (base substrate 2) in a (110) orientation, whereby an elastic layer 3 was obtained. The $SiO_2$ film was formed by a thermal oxidation method, and the $ZrO_2$ film was formed by a sputter method. Then, as a lower electrode 4, a Pt film having a film thickness of 200 nm and a $LaNiO_3$ film having a film thickness of 100 nm were successively laminated on the $ZrO_2$ film by a sputter method. The power for sputtering the Pt film and the $LaNiO_3$ film was 200 W. It was confirmed that the obtained $LaNiO_3$ film was oriented in (100) in a pseudo cubic expression.

Next, a piezoelectric layer 6 composed of the piezoelectric material described above was formed on the $LaNiO_3$ film. To obtain experimental examples, the material expressed by the general formula (1') described above was used, and the value "x" in the general formula (1') was changed by 0.05 in each example from 0.05 to 0.60:

$$(Bi_{1-x}Ba_x)(Fe_{1-x}Ti_x)O_3 \quad (1')$$

More concretely, the piezoelectric layer 6 was obtained in the following manner.

First, reagents of organometallic compounds (bismuth isopropoxide, barium ethoxide, iron acetate, titanium isopropoxide) containing the constituent metals of the piezoelectric material were prepared, respectively. Then, they were mixed such that mole ratios corresponding to the respective compositions of a desired piezoelectric material were obtained, and dissolved (dispersed) in butyl celsolve. Further, diethanolamine as a stabilizing agent for this solution was added in the solution. In this manner, the precursor solution of the piezoelectric material described above was prepared.

Then, the precursor solution was coated on the lower electrode 4 by a spin coat method (precursor solution coating step). Then, a heat treatment (drying) was conducted at a temperature that was about 10° C. higher than the boiling point of the solvent (about 170° C. in the case of butyl celsolve) to remove the solvent to thereby cause gelation (dry thermal treatment step). Then, by further heating the film to about 400° C., organic components other than the solvent remaining in the film were dissolved and removed (degreasing thermal step), whereby an amorphous film having a film thickness of 100 nm was formed. The steps described above were repeated five times. Then, the film was heated by RTA in an oxygen atmosphere at 600° C. for one minute to cause crystallization, whereby a piezoelectric film 6 having a film thickness of 500 nm was formed.

The crystal structure of the piezoelectric material composing the obtained piezoelectric layer 6 was confirmed to be a perovskite structure, in a rhombohedral structure or a monoclinic structure. Accordingly, the polarization direction of the piezoelectric material is assumed to be in a [111] orientation in a pseudo cubic expression. It was confirmed that the piezoelectric material was oriented in (100) in a pseudo cubic expression. The crystal structure, polarization direction and orientation of the piezoelectric material were judged by X-ray θ-2θ measurement and Raman scattering.

Next, a Pt film having a film thickness of 200 nm was formed on the piezoelectric layer 6 as an upper electrode 7 by a sputter method.

The experimental samples of the piezoelectric device 100 were obtained in the manner described above. An electric field of 100 kV/cm was applied by the upper and lower electrodes to the piezoelectric layer 6 of each of the experimental samples to cause lattice distortion. The amount of lattice distortion in the piezoelectric material occurred is shown in Table 1. The amount of lattice distortion was obtained from θ-2θ measurement using electric field X-ray.

TABLE 1

| X | Amount of distortion (%) |
|---|---|
| 0.00 | 0.07 |
| 0.05 | 0.15 |
| 0.10 | 0.20 |
| 0.15 | 0.22 |
| 0.20 | 0.24 |
| 0.25 | 0.26 |
| 0.30 | 0.32 |
| 0.35 | 0.30 |
| 0.40 | 0.25 |
| 0.45 | 0.21 |
| 0.50 | 0.15 |
| 0.55 | 0.08 |
| 0.60 | 0.05 |

As shown in Table 1, the experimental samples with the Ba composition (Ti composition) x being 0.05-0.50 had the amount of lattice distortion that was 0.15% or greater, whereby their favorable piezoelectric characteristics were confirmed. It is noted that, as a reference example, an experimental sample with x being 0 (zero) was also fabricated, and the amount of lattice distortion in this sample was 0.07%, as shown in Table 1.

It was confirmed from the results of the experiment that the piezoelectric material in accordance with the present embodiment has excellent piezoelectric characteristics.

Figure 2:
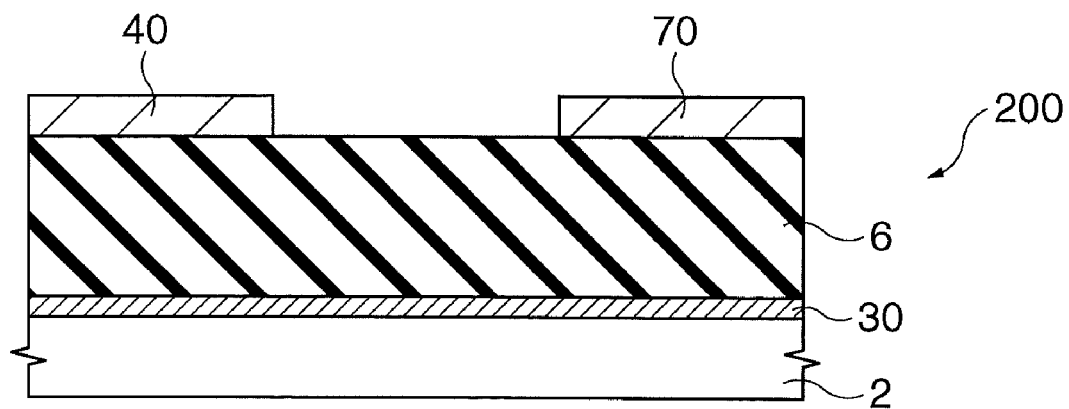
FIG. 2 is a cross-sectional view of a piezoelectric device in accordance with a second embodiment of the invention.

3.1. Next, a piezoelectric device 200 in accordance with a second embodiment of the invention is described. FIG. 2 is a cross-sectional view schematically showing an example of the piezoelectric device 200 in accordance with the second embodiment having a piezoelectric layer 6 composed of the piezoelectric material in accordance with the present embodiment. It is noted that members of the piezoelectric device 200 that are the same as those of the piezoelectric device 100 described above are appended with the same reference numbers, and their detailed description is omitted.

The piezoelectric device 200 includes a base substrate 2, a piezoelectric layer 6 formed above the base substrate 2 and composed of the piezoelectric material described above, a first electrode 40 formed on the piezoelectric layer 6 and a second electrode 70 formed on the piezoelectric layer 6. The piezoelectric device 200 may include a buffer layer 30 formed on the base substrate 2. The piezoelectric layer 6 may be formed on the buffer layer 30.

The buffer layer 30 may have a function to control the crystal orientation of the piezoelectric layer 6. It is noted that, for example, if the base substrate 2 has such a function, the buffer layer 30 may not be provided. The buffer layer 30 may preferably be composed of, for example, an oxide having a perovskite structure and oriented in (100) or (110) in a pseudo cubic expression. As a result, the piezoelectric layer 6 composed of the piezoelectric material having a perovskite structure and oriented in (100) or (110) in a pseudo cubic expression can be readily obtained on the buffer layer 30, through succeeding the crystal structure and orientation of the buffer layer 30. As the oxide composing the buffer layer 30, for example, $LaNiO_3$ or $SrRuO_3$ may be enumerated.

The first electrode 40 and the second electrode 70 are electrodes for applying a voltage to the piezoelectric layer 6. The first electrode 40 and the second electrode 70 may be composed of a single layer of, for example, platinum (Pt), iridium (Ir), iridium oxide (IrOx), or conductive oxide having a perovskite structure (such as, for example, $LaNiO_3$ and $SrRuO_3$) or a laminate of the aforementioned layers, without any particular limitation. The film thickness of the first electrode 40 and the second electrode 70 may be, for example, 100 nm-200 nm.

3.2. Next, a method for manufacturing the piezoelectric device 200 in accordance with the second embodiment is described with reference to FIG. 2.

(A) First, a buffer layer 30 is formed on a base substrate 2. The buffer layer 30 may be formed by, for example, a sputter method, a spin coat method, a CVD method, or a laser ablation method.

(B) Then, a piezoelectric layer 6 is formed on the buffer layer 30. This process is substantially the same as the process of manufacturing the piezoelectric device 100 of the first embodiment described above, and therefore its detailed description is omitted.

(C) Next, a first electrode 40 and a second electrode 70 are formed on the piezoelectric layer 6. The first electrode 40 and the second electrode 70 may be formed by, for example, a sputter method, a spin coat method, a CVD method, or a laser ablation method. The first electrode 40 and the second electrode 70 may be patterned by a known method.

(D) Then, post annealing may be conducted depending on the requirements. The present step is substantially the same as the process of manufacturing the piezoelectric device 100 of the first embodiment described above, and therefore its detailed description is omitted.

By the process described above, the piezoelectric device 200 in accordance with the second embodiment is manufactured.

3.3. The piezoelectric device 200 in accordance with the second embodiment is environmental-friendly and has excellent piezoelectric characteristics, like the piezoelectric device 100 of the first embodiment.

4. Embodiments of the invention are described above in detail. However, it can be readily understood by a person having ordinary skill in the art that many changes can be made without departing in substance from the novel matter and effect of the invention. Accordingly, all of these modified examples are deemed included in the scope of the invention.

For example, the piezoelectric device in accordance with the embodiment of the invention is applicable to an ink jet recording head that may be used in an ink jet printer, an actuator, a gyrocensor, FBAR (film bulk acoustic resonator) type or SMR (solid mounted resonator) type BAW (bulk acoustic wave) filter and SAW (surface acoustic wave) filter, an ultrasound motor and the like. The piezoelectric device in accordance with the embodiment of the invention excels in piezoelectric characteristics and is favorably applicable in a variety of usages.

What is claimed is:

1. A piezoelectric material expressed by a general formula (1) as follows:

$$(Bi_{1-x}Ba_x)(Fe_{1-x}Ti_x)O_3 \quad (1),$$

where x is greater than 0, but smaller than 1 (0<x<1).

2. A piezoelectric material according to claim 1, wherein x is greater than 0, but 0.50 or smaller (0<x≦0.50).

3. A piezoelectric material according to claim 1, being oriented in (100) in a pseudo cubic expression.

4. A piezoelectric material according to claim 1, being oriented in (110) in a pseudo cubic expression.

5. A piezoelectric device comprising:
a base substrate;
a lower electrode formed above the base substrate;
a piezoelectric layer formed above the lower electrode; and
an upper electrode formed above the piezoelectric layer,
wherein the piezoelectric layer is composed of a piezoelectric material that is expressed by a general formula (1) as follows:

$$(Bi_{1-x}Ba_x)(Fe_{1-x}Ti_x)O_3 \quad (1),$$

where x is greater than 0, but smaller than 1 (0<x<1).

6. A piezoelectric device comprising:
a base substrate;
a piezoelectric layer formed above the base substrate;
a first electrode formed above the piezoelectric layer; and
a second electrode formed above the piezoelectric layer and spaced from the first electrode,
wherein the piezoelectric layer is composed of a piezoelectric material that is expressed by a general formula (1) as follows:

$$(Bi_{1-x}Ba_x)(Fe_{1-x}Ti_x)O_3 \quad (1),$$

where x is greater than 0, but smaller than 1 (0<x<1).

7. A piezoelectric device according to claim 5, wherein x is greater than 0, but 0.50 or smaller (0<x≦0.50).

8. A piezoelectric device according to claim 5, wherein the piezoelectric material is oriented in (100) in a pseudo cubic expression.

9. A piezoelectric device according to claim 5, wherein the piezoelectric material is oriented in (110) in a pseudo cubic expression.

10. A piezoelectric device according to claim 5, wherein the piezoelectric material has a rhombohedral structure.

11. A piezoelectric device according to claim 5, wherein the piezoelectric material has a monoclinic structure.

* * * * *